United States Patent [19]

Paul

[11] Patent Number: 4,929,849

[45] Date of Patent: May 29, 1990

[54] NOISE SUPPRESSION IN RECOVERY OF CLOCK FROM NRZ DATA

[75] Inventor: Christopher R. Paul, Bayport, N.Y.

[73] Assignee: Coherent Communications Systems Corp., Hauppauge, N.Y.

[21] Appl. No.: 283,148

[22] Filed: Dec. 9, 1988

[51] Int. Cl.[5] ........................ H03K 5/08; H03K 5/153

[52] U.S. Cl. ...................................... 307/269; 328/63; 328/164; 307/268; 375/118

[58] Field of Search ........................ 307/269, 443, 268; 328/63, 72, 164; 375/110, 118, 120; 331/1 A; 307/269, 443, 268

[56] References Cited

U.S. PATENT DOCUMENTS

| | | | |
|---|---|---|---|
| 4,163,946 | 8/1979 | Alberts | 328/63 |
| 4,227,251 | 10/1980 | Kazama et al. | 328/164 |
| 4,320,515 | 3/1982 | Burton, Jr. | 375/4 |
| 4,363,003 | 12/1982 | Osaka et al. | 331/1 |
| 4,370,617 | 1/1983 | Brandt | 328/63 |
| 4,417,213 | 11/1983 | Ito | 328/164 |
| 4,425,646 | 1/1984 | Kinoshita et al. | 371/61 |
| 4,577,155 | 3/1986 | Kobayashi et al. | 328/164 |
| 4,592,076 | 5/1986 | El-Banna | 375/108 |
| 4,608,702 | 8/1986 | Hirzel et al. | 375/110 |
| 4,644,567 | 2/1987 | Artun et al. | 375/108 |

*Primary Examiner*—Timothy P. Callahan

*Attorney, Agent, or Firm*—Steele, Gould & Fried

[57] ABSTRACT

A clock generator for extracting a clock signal from a data signal includes a timing recovery circuit operable to produce an output recovered clock which is synchronized with transitions occurring at its input. A circuit gates data transitions to the clock recovery circuit input only during time windows defined in a manner based upon the recovered clock. The time windows are produced by comparing the output of an integrator on the recovered clock signal to a reference. The comparator output resets a D-flip flop, to which the data is applied as a clock, the output of the D-flip flop being connected to the input of the timing recovery circuit.

11 Claims, 2 Drawing Sheets

FIG. 1
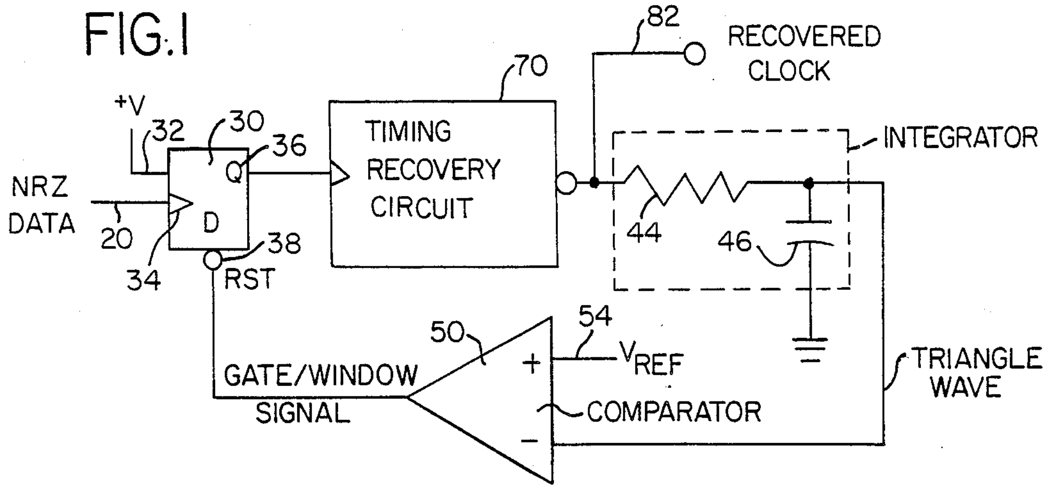
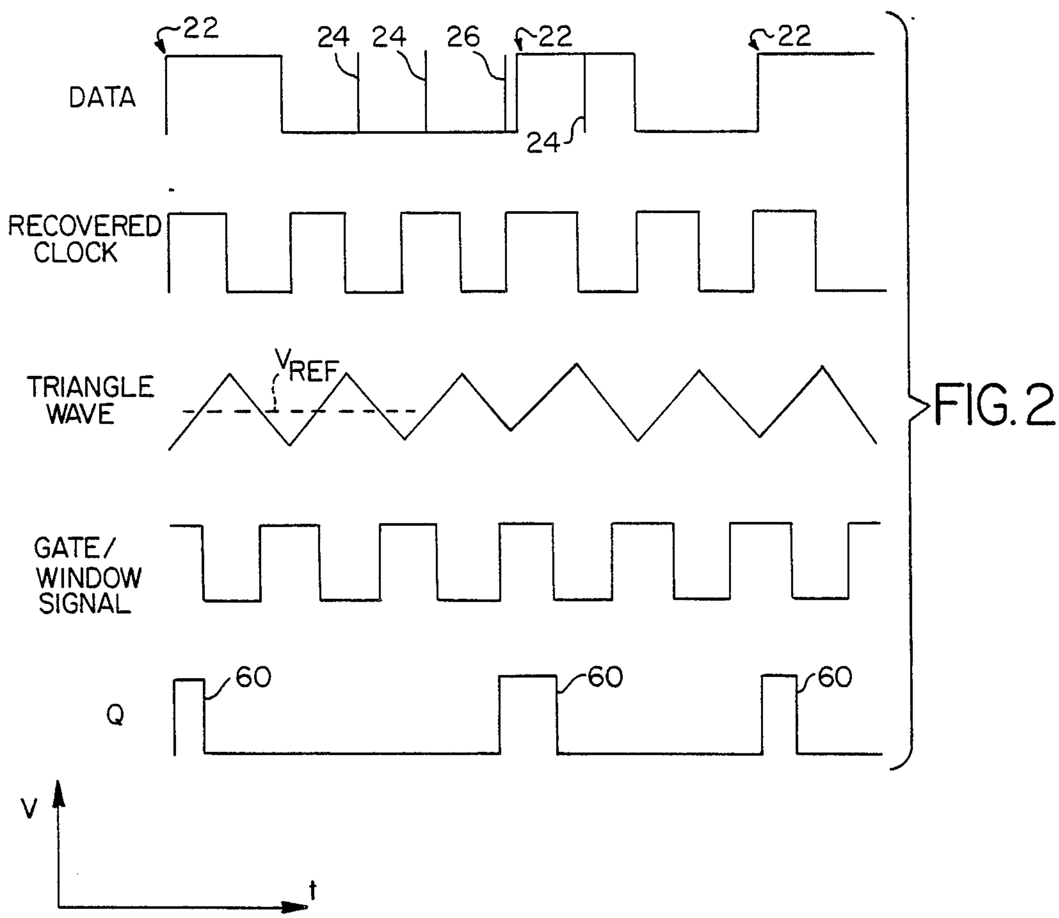
FIG. 2

NOISE SUPPRESSION IN RECOVERY OF CLOCK FROM NRZ DATA

BACKGROUND OF THE INVENTION

1. Field of the Invention

This invention relates to a clock generator operable to extract from a digital data signal a clock signal synchronized with the data signal, wherein transitions are suppressed on the data signal when occurring outside expected time windows, thereby decreasing the incidence of phase excursions produced by noise.

2. Prior Art

Clock recovery or synchronizing devices are known wherein a variable frequency/phase oscillator is controlled in a phase-locked loop using a means detecting phase differences between the oscillator output and a data input, to produce a recovered output clock wherein transitions are synchronized with transitions on the data signal. Inasmuch as the clock can be recovered by tracking transitions in the data, it is not necessary to transmit a clock signal separately from the data in order to synchronize operation at the receiving end with operations at the sending end. The tracking, however, is more complicated than a simple phase-locked loop because due to variations resulting from the constantly-changing nature of data, the data signal may or not have a transition occurring at any particular possible time for such a transition. The prior art has provided clock recovery devices wherein the recovered clock and the data input are applied to a timing recovery circuit such that if a data transition occurs at a particular transition time, the clock frequency can be adjusted as necessary to track the data, and if no transition happens to occur in the data, the recovered clock remains stable and unadjusted. The lack of a transition in the data is not interpreted as an indication that the recovered clock frequency should be reduced.

Clock recovery devices can be applied to non-return to zero ("NRZ") data, wherein the data may be such that no transitions occur for a long time, or so-called manchester-encoded data, wherein transitions occur frequently because the data is inverted during 50% of each data bit. Tracking NRZ data is more demanding because a longer time may elapse between transitions and the clock recovery circuit may be vulnerable to noise. Clock recovery with either manchester or NRZ data requires generating a clock whose transitions coincide with the data transitions or at least maintain a constant phase relationship therewith.

NRZ data signals normally contain a direct current (DC) component, the precise level of which varies with the content of the data due to the incidence of long strings of ones or zeros. A manchester-encoded signal with similar data, however, has no DC component. The data is combined with a clock signal such that for each data bit, the signal is inverted for half the bit length, thereby avoiding any DC component which could produce difficulties in transmission. In either case a clock signal can be recovered from the data, with care taken to pass to the clock-controlling circuits only valid transitions.

The data signal can be recovered at the receiver by suitably monitoring the positive and negative going transitions in the encoded signal. The transitions are compared with a recovered clock signal produced by synchronizing an oscillator with the transitions, to reproduce the NRZ data. When a data transition occurs the clock is corrected, or adjusted more closely to match the frequency/phase of the data.

Difficulties occur when noise occurs on the data signal. The noise is misinterpreted as a transition, causing the controlled variable oscillator to drop out of synchronism with the true data signal, and possibly garbling the data due to missed or added clock transitions. Certain techniques have been proposed to minimize the occurrence of such losses of synchronism, also known as phase excursions, by attempting to discriminate good data transitions from noise pulses. Noisy data may contain extra, missing or displaced transitions, which if accepted produce clock jitter and possibly produce relatively long-lived phase excursions sufficient to result in wholly deleted or extra cycles in the recovered clock.

It is possible to reduce the sensitivity of a clock recovery circuit to extra, missing or displaced transitions by recognizing that data transitions which occur far in time from the expected transition times, i.e., synchronously with transitions on the NRZ data, are likely to be spurious and should be kept from generating correction signals. Data transitions normally occur on the rising transition of the recovered clock. Screening for transitions has been attempted according to the prior art by a number of techniques, including defining gating windows which are periodically opened at the expected time of a next clock transition. This time window can be calculated or measured according to the art, by the passage of time following the previous clock transition, i.e., following the previous transition on the recovered clock which would have corresponded to a data transition.

Accordingly, a typical prior art technique is to use a monostable multivibrator ("one shot") to open the window for passing data transitions to the clock recovery circuit at a certain time after the last clock transition. In U.S. Pat. No. 4,370,617-Brandt, a series of one shots are employed in connection with a phase-locked loop control for the purpose of suppressing rapid phase excursions. A first one shot, triggered by the previous clock transition, times out slightly prior to the next expected clock transition, thereby triggering a next one shot and opening a window during which transitions will be accepted. The window is defined by the pulse length of the second one shot. One can use a similar technique wherein a second one shot closes a window after being triggered by an accepted clock transition, the window being defined between the time-outs of the first and second one shots. In any case, at least two one shots are necessary in order to open and close a window by this technique, namely a delay for data transitions lagging the expected transition as defined by the recovered clock (after which the window closes), and a delay until just preceding the next clock transition, for data transitions leading the clock transitions (to open the window). The one shots must each have a predetermined time constant, preferably defining a narrow window. Therefore, the device is optimally useful only for a narrow frequency range.

U.S. Pat. No. 4,363,003-Osaka et al, also defines a window during which data transitions will be accepted for producing corrections to a phase-locked loop frequency generator. The Osaka invention is intended to improve on one shot windowing techniques, instead using a counter operable to count down a recovered clock signal at a frequency some multiple higher than the data transition rate, this higher rate clock thus defining a plurality of increments or subdivisions of clock intervals, which are counted up to equal the data transition clock interval. In this manner, the rate of data transitions or clocks can be divided, for example, into sixteen increments and only data transitions occurring during the last and first increment are accepted as transitions which are passed for clock correction, if necessary. The drawback of an arrangement according to Osaka is that a plurality of digital circuits are needed for the counter and for digital comparators necessary to open and close the window at the appropriate counted intervals. At high data rates, the propagation delay through the counters may be prohibitive, especially if a large number of clock subdivisions are to be counted.

U.S. Pat. No. 4,592,076-Le-Banna discloses another alternative windowing technique. When a "window mode" is selectable, the incoming data will be passed to an output only within a certain phase interval of clock transitions. Re-initialization (correction) of the phase-locked loop is inhibited except when a transition is expected. The window is produced by generating an out-of-phase clock signal, ninety degrees out of phase with the expected transitions, for opening and closing the window. The technique apparently gates data rather than clocks and the ninety degree phase delay presumably requires a two bit counter.

U.S. Pat. No. 4,425,646-Kinoshita et al also defines a window by counting down a clock signal. The clock is produced at a much higher frequency than the data transition frequency. Phase-locked loops are frequently provided with oscillators operable at a multiple of the frequency of the incoming control frequency, and operate correctly because the higher frequency is counted down to match the control frequency.

Other examples of devices for synchronizing a recovered clock to data notwithstanding the variable nature of data are disclosed in U.S. Pat. Nos. 4,644,567-Artun et al; 4,608,702-Hirzel et al; 4,320,515-Burton, Jr.; and, 4,163,946-Alberts. The disclosures of all the foregoing patents are incorporated herein.

None of the foregoing patents discloses a method and apparatus for producing a window centered on the expected clock transition time, using a minimum number of circuits in a manner which is substantially independent of the frequency of the clock. According to the present invention, an integrator and comparator are used to define such a window, thereby precluding the need for a plurality of flip flops and digital comparators in a device for counting down a multiple of the clock to define sub-interval windows. The invention also precludes the need to define a specific frequency for operation, as is characteristic of windows defined by one shots.

The integrator according to the invention can be as simple as a resistor in series with the recovered clock and a capacitor in parallel therewith, the time constant of the RC connection being much larger than the expected clock frequency such that the output is substantially a triangular wave. The comparator is preferably a high gain differential amplifier comparing the triangular wave to a reference voltage which can be fixed or variably set as close to the peaks of the triangular wave as required for the necessary noise suppression ratio. This level can be, for example, equal to the average level of the output of the phase-locked-loop recovered clock output. The invention is operable with NRZ data and with manchester-encoded data, and is simple, effective and inexpensive.

SUMMARY OF THE INVENTION

It is an object of the invention to produce a means for suppressing noise at the input of a clock recovery circuit, with maximum effectiveness and minimum expense and complexity.

It is another object of the invention to suppress erroneous transitions at the input of a clock recovery circuit in a manner that is independent of the frequency at which the device is operated.

It is a further object of the invention to allow selection of sensitivity in a window-defining clock recovery circuit.

It is yet another object of the invention to employ a lossy integrator to produce a triangular wave, the peaks of which are compared to a reference to define a window during which clock transitions will be accepted for correction of a recovered clock signal.

These and other objects are accomplished by a clock generator for extracting a clock signal from a data signal, including a timing recovery circuit operable to produce an output recovered clock which is synchronized with transition flags occurring at its input. A circuit generates data transitions to the clock recovery circuit input only during time windows defined in a manner based upon the recovered clock. The time windows are produced by comparing the output of an integrator on the recovered clock signal to a reference. The comparator output resets a D-flip flop, to which the data is applied as a clock, the output of the D-flip flop being connected to the input of the timing recovery circuit.

BRIEF DESCRIPTION OF THE DRAWINGS

There are shown in the drawings the embodiments which are presently preferred. It should be understood, however, that the invention is not limited to the particular arrangements and instrumentalities shown in the drawings, wherein:

FIG. 1 is a schematic diagram of a timing recovery circuit with time windowing circuit according to the invention.

FIG. 2 is a timing diagram illustrating a data signal with correct and spurious transitions, a recovered clock signal and representations of outputs of the lossy integrator, comparator and gating D-flip flop.

DETAILED DESCRIPTION OF THE PREFERRED EMBODIMENTS

Figure 3:
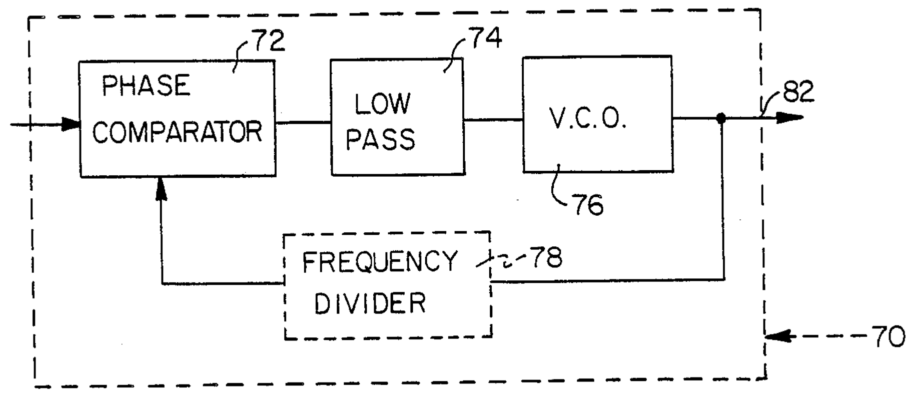
FIG. 3 is a block diagram of a timing recovery circuit for use with the invention, with optional frequency divider.

As shown in FIG. 1, non-return-to-zero (NRZ) data is input on line 20, and a recovered clock is produced on output 82, a timing recovery circuit being interposed to extract from the NRZ data a recovered clock whose transitions are synchronous with data transitions, at least having a constant phase and frequency relationship with the data transitions. The circuit as shown in FIG. 1 is discussed together with the timing diagram of signals shown in FIG. 2.

The incoming data signal on line 20 has positive and negative transitions occurring synchronously with clock transitions. However, due to variation in the content of the data, not every clock transition has a data transition at the same time. It is unpredictable whether or not a transition will occur in the data at a particular possible transition time. Nevertheless, each positive (rising) transition in the data should coincide with a transition (also positive or rising) on the clock signal. Any data transitions 22 which occur too far in time from the positive transitions of the currently-produced recovered clock signal are likely to be spurious and should be kept from generating correction signals to timing recovery circuit 70. In order to accomplish removal of spurious or misplaced transitions 24 on the data signal, the recovered clock signal from the timing recovery circuit is used to generate a timing window. The window is centered on the expected positive transitions in the clock and as a result of the technique employed herein, will be substantially independent of frequency and requires no digital counting circuits in order to define particular subdivision increments of the overall clock during which the window is opened.

The output of the timing recovery circuit 70, namely the recovered clock signal 82, is a square wave of a frequency B Hertz, where B is the bit rate in bits per second of the NRZ data. The timing recovery circuit may have, as known in the art, a phase comparator whose output controls a variable oscillator, whereby transitions which are applied to the input of timing recovery circuit 70 will be tracked by circuit 70, the device producing a recovered clock output 82 which will increase in frequency (i.e., advance in phase) if the transitions on the recovered clock output are lagging those on the input, and vice-versa. An example of such a timing recovery circuit 70 is shown in FIG. 3, including a phase comparator 72, low pass filter 74 and voltage-controlled oscillator 76. Timing recovery circuits of this general type are known in the art, as disclosed in the patents cited hereinabove in the "Background" section of the specification, the disclosures of which are hereby incorporated.

On the output of timing recovery circuit 70, namely connected to recovered clock signal 82, is an integrator whose output increases during a high level of recovered clock 82 and decreases during a low level thereof. The integrator can be preceded by a DC-blocking capacitor or the like (not shown), or a lossy integrator can be employed. The lossy integrator shown comprises a series resistor 44 and parallel capacitor 46. The resistor and capacitor define a time constant RC which is sufficiently greater than the period of the recovered clock (1/B), that a substantially flat-sided triangular wave as shown in FIG. 2 is produced at the output of the lossy integrator, rather than a less symmetrical sawtooth as more characteristic of exponential charging with a lower time constant. The transitions across the midpoint of the triangular wave are delayed compared to the transitions on the recovered clock such that the triangular wave crosses its mid point at a delay of one half of a bit as compared to the transitions on the clock signal.

The triangular wave output of the lossy integrator is applied to a voltage comparator 50, which re-squares the triangular wave by comparing the triangular wave to a reference. In the embodiment shown, the triangular wave is applied to the inverting input of the comparator and the non-inverting input 54 is maintained at a reference voltage which may, for example, be equal to the DC level of the integrator output. The output of the comparator 50 is used as a gating or window signal, driving the reset input 38 of the D-flip flop 30. In the illustrated embodiment, the D-flip flop is reset by the square wave gate or window output from comparator 50, which is delayed a quarter of a bit relative to the clock, and is inverted.

As a result of this connection, the Q output 36 of flip flop 30 is held low and the timing recovery circuit is caused to ignore any data transitions which occur farther than a quarter of a bit from a positive-going clock transition. So long as the recovered clock is properly tracking the data, any data transitions which occur more than a quarter of a bit from the positive-going clock transition are highly likely to be spurious transitions, for example transitions 24 as shown in FIG. 2.

The first positive-going data transition which occurs within one quarter of a bit in time from a positive-going clock transition, i.e., a transition which occurs outside of the time the D-flip flop 30 is held reset by the output of comparator 50, causes the Q output of the D-flip flop to go high. This is interpreted by timing recovery circuit 70 as a valid transition. Timing recovery circuit 70 corrects the frequency or phase of its output as needed to cause the recovered clock output 82 to track the data transition. Subsequent positive data transitions arriving before the comparator output resets the flip flop will not affect the Q output, which has already been set. The timing recovery circuit therefore will respond to a positive transition which occurs immediately before the expected transition, for example positive transition 26, shown in FIG. 2. However, the timing recovery circuit cannot generate more than one correction signal even where a positive transition leading the valid transition 22 occurs within the window just prior to the expected transition, thereby rendering the device insensitive to short bursts of noise.

The device is capable of a number of variations which will now become apparent. As shown in FIG. 3, it is possible to use a frequency divider 78 in addition to the voltage controlled oscillator 76, whereby the actual output frequency of the voltage controlled oscillator can be higher than the corresponding data rate. In that case, recovered clock output 82 should be taken from the frequency divider rather than from the output of the voltage controlled oscillator.

Other forms of integrators or integrators and filters may be possible in addition to the RC version shown in FIG. 1. Similarly, it is possible continuously to control the level of the reference voltage applied to non-inverting input 54 of comparator 50, to control the width of the window of valid data. As discussed above, the reference voltage can be equal to (or a proportion of) the average value of the recovered clock signal. The average alternatively can be the output of a low-pass filter connected to the data signal, thereby varying in time. By defining a triangular wave with a peak (or valley) corresponding in time to an expected clock transition, the circuit of the invention allows easy variation of the time width of the window by moving the reference voltage applied to comparator 50 higher or lower. The threshhold reference voltage can be continuously controlled over time, for example to more quickly recover from error conditions produced by a loss of data or bursts of noisy data. If a noise burst is detected the window can be narrowed, or after data loss the voltage reference can be varied to define a reset condition in which the window is widened in order to more quickly resume correct tracking when synchronization between the clock and the data is lost.

Means external to the clock tracking circuit can be used to select a particular window by varying the threshhold reference voltage among discrete levels to be gated on, or alternatively, the levels may be dynamically controlled over a continuous voltage range by integration of a control signal. Detection of noise or errors for varying the threshhold can be data dependent, such as based on the results of errors found by cyclic redundancy checking (CRC), etc. Appropriate error checking circuitry (not shown) adjusts the reference voltage to more quickly resume accurate tracking after a loss of synchronism. Other variations will also be apparent.

The invention as disclosed herein is a clock generator for extracting a clock signal (82) from a data signal (20), comprising a timing recovery circuit (70) operable to produce a recovered clock signal (82) substantially synchronized with transitions (22) occurring at an input to said timing recovery circuit (70), the timing recovery circuit (70) being operable to seek a constant phase relationship between the data signal (20) and the recovered clock signal (82) during phase excursions of the data signal (20); a triangle wave generator (44, 46) responsive to the recovered clock signal (82), the sawtooth generator (44, 46) producing a triangle wave from the recovered clock signal (82); a comparator (50) operable to compare the triangle wave to a reference voltage (54), and to produce an output at one of two discrete levels as a function of relative levels of the triangle wave and the reference voltage; and, a gate (30) operable to generate a data transition flag to the input to the timing recovery circuit (70) only when the comparator output is at one of said two levels, thereby defining a gate window, the gate window defining a maximum phase excursion for valid transitions in the data (20).

The triangle wave generator can have an integrator, preferably a lossy integrator (44, 46), which can include a resistor (44) in series and a capacitor (46) in parallel with an output (82) of the timing recovery circuit (70) producing the recovered clock signal (82). Preferably, the resistor (44) and capacitor (46) define a time constant much greater than a period of the recovered clock signal (82).

The reference voltage (54) can be an average value of the recovered clock signal (82). The data signal (20) can be a non-return-to-zero (NRZ) data signal (20). The timing recovery circuit preferably includes a phase-locked loop (72, 74, 76). The gate (30) can be formed by a D-flip flop (30) connected to be reset by the output of the comparator (50).

The clock generator of the invention, for extracting a clock signal from a non-return to zero (NRZ) data signal, includes a timing recovery circuit (70) operable to produce an output (82) seeking a constant phase relationship with an input to the timing recovery circuit (70). A lossy integrator (44, 46) is connected to the output (82) of the timing recovery circuit and is operable to produce a periodic wave having high or low peaks centered on transitions in the recovered clock (82). A comparator (50) is responsive to the periodic wave and is operable to compare the periodic wave to a reference and to produce an output defining a window substantially centered on said peaks. A gate (30) connected between the NRZ data and the input to the timing recovery circuit (70) generates data transition flag to the timing recovery circuit (70) only when said transitions occur within the window.

The lossy integrator is preferably a resistor/capacitor combination (44, 46) having a time constant substantially greater than a maximum period of the recovered clock, whereby the periodic wave is a sawtooth wave. The sawtooth wave preferably lags the clock signal by substantially one fourth of a bit, and is inverted relative to the clock signal. The reference to which the comparator compares the periodic wave is preferably substantially equal to an average value of the clock signal.

The invention is subject to a number of variations and combinations of features disclosed herein, and reference should be made to the appended claims in order to properly assess the scope of the invention in which exclusive rights are claimed.

What is claimed is:

1. A clock generator for extracting a clock signal from a data signal, comprising:
   - a timing recovery circuit operable to produce a recovered clock signal substantially synchronized with transitions occurring at an input to said timing recovery circuit, the timing recovery circuit being operable to seek and find a constant phase relationship between the data signal and the recovered clock signal during phase excursions of the data signal;
   - a triangle wave generator responsive to the recovered clock signal, the triangle wave generator producing a triangle wave from the recovered clock signal;
   - a comparator operable to compare the triangle wave to a reference voltage, and to produce an output at one of two discrete levels as a function of relative levels of the triangle wave and the reference voltage; and,
   - a gate operable to generate a data transition flag which is supplied to the timing recovery circuit only when the comparator output is at one of said two levels, thereby defining a gate window, the gate window defining a maximum phase excursion for valid transitions in the data.

2. The clock generator of claim 1, wherein the triangle wave generator is a lossy integrator.

3. The clock generator of claim 2, wherein the lossy integrator includes a resistor in series and a capacitor in parallel with an output of the timing recovery circuit producing the recovered clock signal, the resistor and the capacitor defining a time constant sufficiently greater than a period of the recovered clock signal that the triangle wave is substantially flat sided.

4. The clock generator of claim 1, wherein the reference voltage is an average value of the recovered clock signal.

5. The clock generator of claim 1, wherein the data signal is a non-return-to-zero (NRZ) data signal.

6. The clock generator of claim 1, wherein the timing recovery circuit includes a phase-locked loop.

7. The clock recovery generator of claim 1, wherein the gate is formed by a D-flip flop connected to be reset by the output of the comparator, the D-flip flop being unable to generate data transition flags when reset, whereby the clock recovery generator is insensitive to short bursts of noise.

8. A clock signal generator for extracting a clock signal from non-return to zero (NRZ) data, comprising:
   - a timing recovery circuit operable to produce an output seeking and finding a constant phase relationship with an input to the timing recovery circuit;
   - an integrator connected to the output of the timing recovery circuit and operable to produce a periodic wave having peaks centered on transitions in the recovered clock;

a comparator responsive to the periodic wave and operable to compare the periodic wave to a reference and produce an output defining a window substantially centered on said peaks; and, a gate connected between the NRZ data and the input to the timing recovery circuit, the gate generating a data transition flag for the timing recovery circuit only when said transitions occur within the window.

9. The clock generator of claim 8, wherein the integrator is a lossy integrator comprised of a resistor/-capacitor combination having a time constant substantially greater than a maximum period of the recovered clock, whereby the periodic wave is a triangle wave.

10. The clock generator of claim 9, wherein the triangle wave lags the clock signal by substantially one fourth of a bit, and is inverted relative to the clock signal.

11. The clock generator of claim 8, wherein the reference is substantially equal to an average value of the clock signal.

* * * * *